United States Patent
Yang et al.

(10) Patent No.: US 11,953,774 B2
(45) Date of Patent: Apr. 9, 2024

(54) DISPLAY SUBSTRATE, LIQUID CRYSTAL DISPLAY PANEL, AND LIQUID CRYSTAL DISPLAY DEVICE

(71) Applicants: Beijing BOE Display Technology Co., Ltd., Beijing (CN); BOE Technology Group Co., Ltd., Beijing (CN)

(72) Inventors: Xinlan Yang, Beijing (CN); Wenkai Mu, Beijing (CN); Yi Liu, Beijing (CN); Jun Fan, Beijing (CN); Bo Feng, Beijing (CN); Yang Wang, Beijing (CN); Zhan Wei, Beijing (CN); Tengfei Ding, Beijing (CN); Shijun Wang, Beijing (CN); Chengfu Xu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/921,085

(22) PCT Filed: Jun. 8, 2021

(86) PCT No.: PCT/CN2021/098815
§ 371 (c)(1),
(2) Date: Oct. 24, 2022

(87) PCT Pub. No.: WO2022/022070
PCT Pub. Date: Feb. 3, 2022

(65) Prior Publication Data
US 2023/0168534 A1 Jun. 1, 2023

(30) Foreign Application Priority Data

Jul. 29, 2020 (CN) .......................... 202010742149.2

(51) Int. Cl.
*G02F 1/1335* (2006.01)
*G02F 1/1333* (2006.01)
(Continued)

(52) U.S. Cl.
CPC .... *G02F 1/133512* (2013.01); *G02F 1/13338* (2013.01); *G02F 1/134345* (2021.01);
(Continued)

(58) Field of Classification Search
CPC .......... G02F 1/133512; G02F 1/13312; G02F 1/136286; G02F 1/134345; G02F 1/1368;
(Continued)

(56) References Cited

U.S. PATENT DOCUMENTS

2005/0117079 A1* 6/2005 Pak et al.
2007/0131936 A1* 6/2007 Kang
(Continued)

FOREIGN PATENT DOCUMENTS

CN 101896862 A 11/2010
CN 102937853 A 2/2013
(Continued)

OTHER PUBLICATIONS

CN202010742149.2 first office action.
PCT/CN2021/098815 international search report.

*Primary Examiner* — Hoan C Nguyen
(74) *Attorney, Agent, or Firm* — IPro, PLLC (57) ABSTRACT

A display substrate includes: a base substrate (100); a plurality of sub-pixels (R, G, B) located on the base substrate (100), every two rows of sub-pixels (R, G, B) constituting a pixel group; a plurality of first gate lines (Gate1) located at first row gaps between the pixel groups, two first gate lines (Gate1) being arranged at each first row gap; and a plurality of photosensors (101), the orthographic projection of each row of photosensors (101) on the base substrate (100)
(Continued)

completely covering a second row gap in the pixel group and partially overlapping with the orthographic projections of the sub-pixels (R, G, B), thereby avoiding the bright and dark difference between adjacent rows and ensuring the aperture ratio.

13 Claims, 4 Drawing Sheets

(51) Int. Cl.
| | | |
|---|---|---|
| *G02F 1/1343* | (2006.01) | |
| *G02F 1/1362* | (2006.01) | |
| *G02F 1/1368* | (2006.01) | |
| *G06V 40/13* | (2022.01) | |
| *H01L 27/12* | (2006.01) | |

(52) U.S. Cl.
CPC ...... *G02F 1/136286* (2013.01); *G02F 1/1368* (2013.01); *G06V 40/1318* (2022.01); *H01L 27/124* (2013.01); *G02F 1/13439* (2013.01)

(58) Field of Classification Search
CPC ............. G02F 1/13318; G02F 1/13338; G02F 1/13439; G06V 40/1318; H01L 27/124
See application file for complete search history.

(56) References Cited

U.S. PATENT DOCUMENTS

| | | |
|---|---|---|
| 2008/0002128 A1* | 1/2008 | Park |
| 2010/0156850 A1* | 6/2010 | Kurokawa |
| 2010/0295756 A1 | 11/2010 | Yoshida et al. |
| 2011/0109592 A1* | 5/2011 | Kurokawa |
| 2013/0037815 A1* | 2/2013 | Okajima |
| 2014/0111710 A1 | 4/2014 | Yang et al. |
| 2016/0259460 A1 | 9/2016 | Yang et al. |
| 2019/0340409 A1 | 11/2019 | Zhu et al. |
| 2020/0111859 A1 | 4/2020 | Ko et al. |
| 2020/0126472 A1 | 4/2020 | Tang et al. |
| 2020/0356205 A1 | 11/2020 | Sun et al. |
| 2022/0320217 A1 | 10/2022 | Han et al. |

FOREIGN PATENT DOCUMENTS

| | | |
|---|---|---|
| CN | 103412675 A | 11/2013 |
| CN | 107656643 A | 2/2018 |
| CN | 109445182 A | 3/2019 |
| CN | 110427874 A | 11/2019 |
| CN | 111025722 A | 4/2020 |
| CN | 111308755 A | 6/2020 |
| CN | 111403455 A | 7/2020 |
| CN | 111752030 A | 10/2020 |
| KR | 20010009601 A | 2/2001 |
| KR | 20070071201 A | 7/2007 |
| WO | 2019052253 A1 | 3/2019 |
| WO | 2020093797 A1 | 5/2020 |

* cited by examiner

Fig. 1

-- Prior Art--

DISPLAY SUBSTRATE, LIQUID CRYSTAL DISPLAY PANEL, AND LIQUID CRYSTAL DISPLAY DEVICE

CROSS REFERENCE TO RELATED APPLICATIONS

The present application is a national phase entry under 35 U.S.C. § 371 of International Application No. PCT/CN2021/098815, filed on Jun. 8, 2021, which claims priority of Chinese Patent Application No. 202010742149.2, filed with the China National Intellectual Property Administration on Jul. 29, 2020 and entitled "DISPLAY SUBSTRATE, LIQUID CRYSTAL DISPLAY PANEL, AND LIQUID CRYSTAL DISPLAY DEVICE", the entire contents of which are incorporated herein by reference.

FIELD

The present disclosure relates to the technical field of display, in particular to a display substrate, a liquid crystal display panel, and a liquid crystal display device.

BACKGROUND

With continuous development of a terminal technology, electronic devices are applied more and more widely. Since a skin grain, such as a fingerprint pattern or a palm print pattern, is unique, in order to protect information safety of a user, a fingerprint recognition function is applied to the electronic devices more and more generally, like mobile phone unlocking and mobile payment (such as payment and transfer).

SUMMARY

On one aspect, embodiments of the present disclosure provide a display substrate, including:
a base substrate;
a plurality of sub-pixels, located on the base substrate; every two rows of sub-pixels constituting a pixel group;
a plurality of first gate lines, located at first row gaps between adjacent pixel groups, and two first gate lines being arranged at each first row gap; and
a plurality of photosensors, orthographic projections of each row of photosensors on the base substrate completely covering a second row gap in the pixel group, and partially overlapping with orthographic projections of the sub-pixels.

Optionally, in the display substrate provided by the embodiments of the present disclosure, a width of the first row gap is equal to a width of the second row gap.

Optionally, in the display substrate provided by the embodiments of the present disclosure, overlapping areas of the orthographic projections of the photosensors on the base substrate and orthographic projections of sub-pixels on two sides of the second row gap are the same.

Optionally, in the display substrate provided by the embodiments of the present disclosure, every n sub-pixels arrayed in a row direction constitute a pixel, and n is a positive integer.

A length of the photosensor in the row direction is equal to a length of a plurality of pixels in the row direction.

Optionally, in the display substrate provided by the embodiments of the present disclosure, each of the sub-pixels includes a first transistor located between a layer where the plurality of photosensors are located and the base substrate.

In one first row gap, one row of the first transistors is electrically connected to one first gate line at the first row gap, and the other row of the first transistors is electrically connected to the other first gate line at the first row gap.

Optionally, in the display substrate provided by the embodiments of the present disclosure, each of the sub-pixels further includes: a planar common electrode, an insulating layer and a slit pixel electrode sequentially located on one side, facing away from a layer where the first transistors are located, of the layer where the plurality of photosensors are located. The slit pixel electrodes and the first transistors are electrically connected.

Optionally, the display substrate provided by the embodiments of the present disclosure further includes: drive circuits in one-to-one correspondence with the photosensors, and orthographic projections of the drive circuits on the base substrate are located in the second row gaps.

Optionally, in the display substrate provided by the embodiments of the present disclosure, the drive circuits include: second transistors, third transistors and fourth transistors disposed in the same layer with the first transistors.

Gate electrodes of the second transistors are electrically connected to second gate lines, first electrodes of the second transistors are electrically connected to a first power line, and second electrodes of the second transistors are electrically connected to the photosensors;

Gate electrodes of the third transistors are electrically connected to the photosensors, first electrodes of the third transistors are electrically connected to a second power line, and second electrodes of the third transistors are electrically connected to first electrodes of the fourth transistors.

Gate electrodes of the fourth transistors are electrically connected to third gate lines, and second electrodes of the fourth transistors are electrically connected to a reading line.

Optionally, in the display substrate provided by the embodiments of the present disclosure, orthographic projections of the second gate lines and the third gate lines on the base substrate are located in the second row gaps.

On another aspect, embodiments of the present disclosure provide a liquid crystal display panel, including a display substrate and a color film substrate at opposite positions, and a liquid crystal layer located between the display substrate and the color film substrate. The display substrate is the above display substrate.

Optionally, in the liquid crystal display panel provided by the embodiments of the present disclosure, the color film substrate includes: a black matrix.

The black matrix includes: first parts covering the second row gaps. First overlapping areas of an orthographic projection of the first part on the base substrate and orthographic projections of sub-pixels on two sides of the second row gap are the same.

Optionally, in the liquid crystal display panel provided by the embodiments of the present disclosure, the first parts have a plurality of openings, and the orthographic projections of the photosensors on the base substrate are located in orthographic projections of the openings.

Optionally, in the liquid crystal display panel provided by the embodiments of the present disclosure, the black matrix further includes: second parts covering the first row gaps. Second overlapping areas of the orthographic projection of the second part on the base substrate and orthographic projections of the sub-pixels on two sides of the first row gap are the same.

Optionally, in the liquid crystal display panel provided by the embodiments of the present disclosure, the first overlapping area and the second overlapping area are same.

On the other aspect, embodiments of the present disclosure provide a liquid crystal display device, including: the liquid crystal display panel, and a backlight module located on a light-in side of the liquid crystal display panel.

DETAILED DESCRIPTION OF THE EMBODIMENTS

In order to make purposes, technical schemes and advantages of embodiments of the present disclosure clearer, the technical schemes of the embodiments of the present disclosure will be described more clearly and completely by combining drawings of the embodiments of the present disclosure. It should be noted that the sizes and shapes of all diagrams in the drawings do not reflect the true proportion, and only aim to illustrate the content of the present disclosure. In addition, the same or similar mark numbers represent the same or similar elements or elements having the same or similar functions all the way. Apparently, the described embodiments are part of the embodiments of the present disclosure instead of all of the embodiments. Based on the described embodiments of the present disclosure, all other embodiments obtained by those ordinarily skilled in the art without inventive efforts should all fall within the protection scope of the present application.

Unless otherwise defined, technical terms or scientific terms used herein should be the ordinary meaning understood by those ordinarily skilled in the art of the present disclosure. "First", "second" and other similar words used in the specifications and claims of the present disclosure do not represent any sequence, quantity or importance, and are only used for distinguishing different constitution parts. "Include" or "comprise" and other similar words refer to elements or objects before the words covering elements or other objects and equivalents thereof illustrated after the words without excluding other elements or objects. "In", "out", "upper", "lower" and the like are only used for representing a relative position relation, and the relative position relation may also be changed after the absolute position of the described objects is changed.

Figure 1:
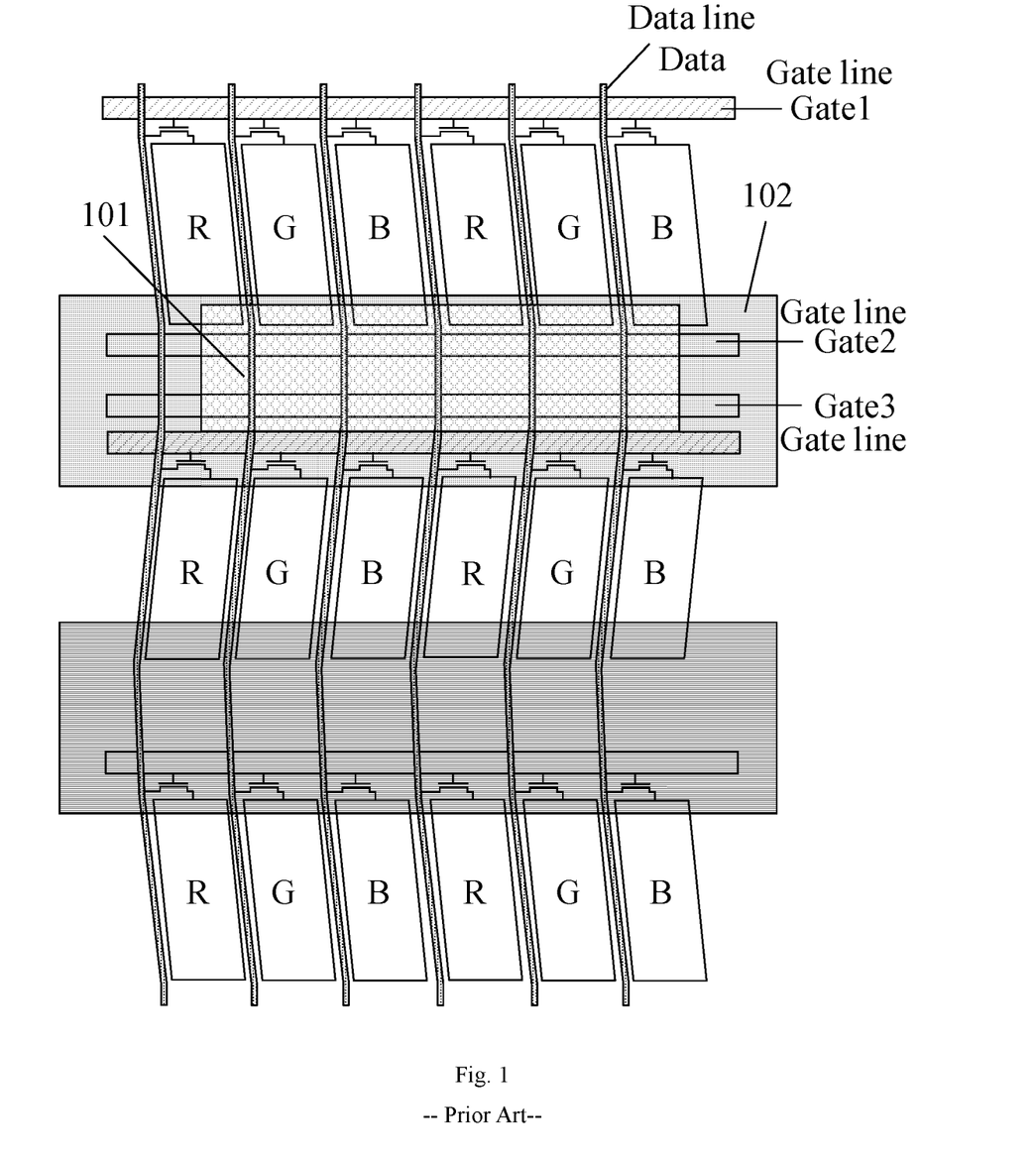
FIG. 1 is a schematic structural diagram of a top view of a related liquid crystal display panel.

A liquid crystal display (LCD) device is widely applied to modem information equipment, such as, a display, a TV, a mobile phone and a digital product, due to its advantages like low weight, less power consumption, low radiation, and portability. In the related art, as shown in FIG. 1, a first gate line Gate1 is arranged between each pixel row of the liquid crystal display device, and each photosensor (Sensor) used for fingerprint recognition correspond to M*N (M$\geq$ 1, N $\geq$ 2) pixels, wherein M is a quantity of corresponding pixels in an extending direction of the first gate lines Gate1, and N is a quantity of corresponding pixels in an extending direction of a data line Data. The photosensor and a second gate line Gate2 and a third gate line Gate3 both electrically connected to the photosensor are all located in a raw gap between pixel rows where the pixels corresponding to the photosensor are located. In order to avoid brightness difference of adjacent rows, a black matrix (BM) shielding the row gap should be enlarged to guarantee the uniform transmittance of the adjacent rows, resulting in 20% of relative reduction of an aperture opening ratio after the pixel structure is loaded with the photosensors.

Figure 2:
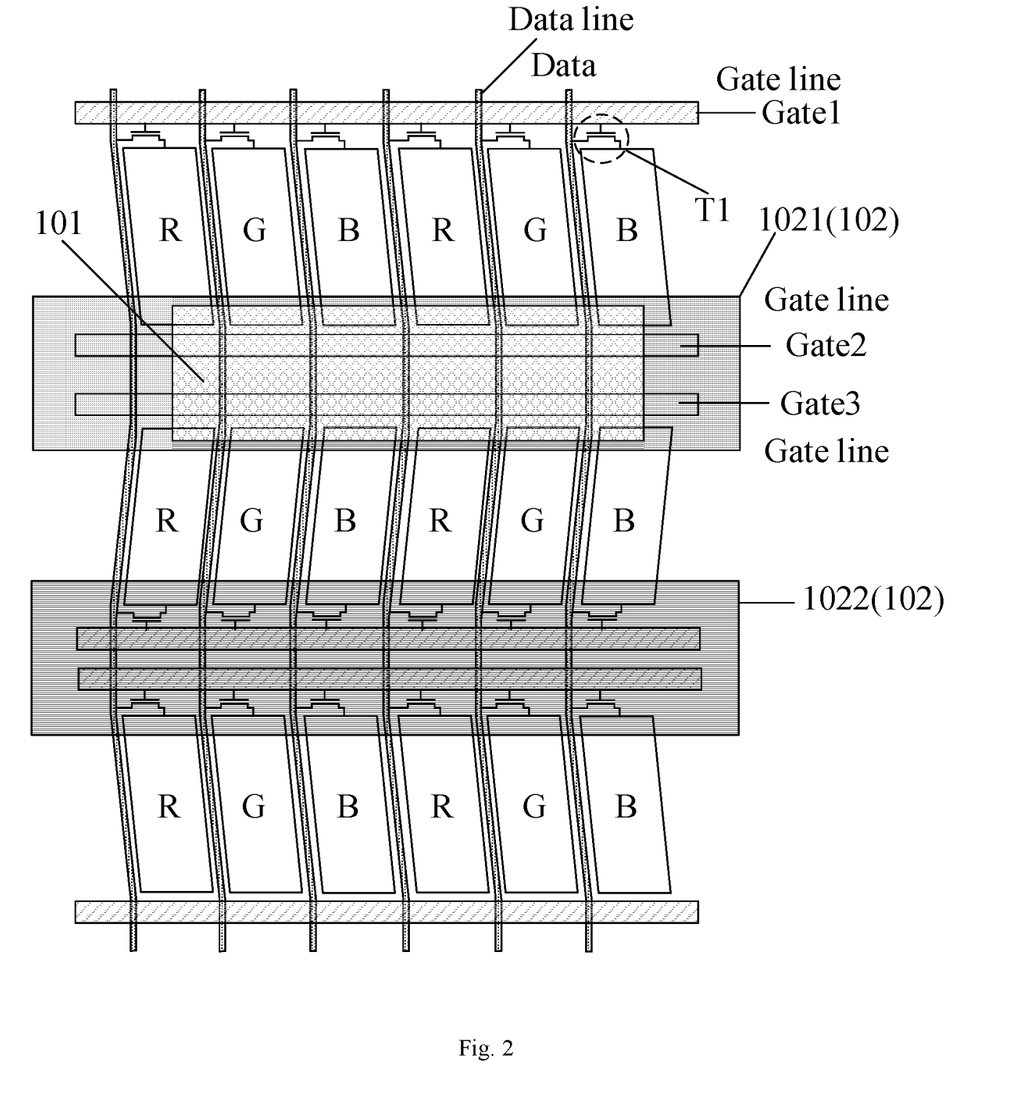
FIG. 2 is a schematic structural diagram of a top view of a liquid crystal display panel provided by an embodiment of the present disclosure.
Figure 3:
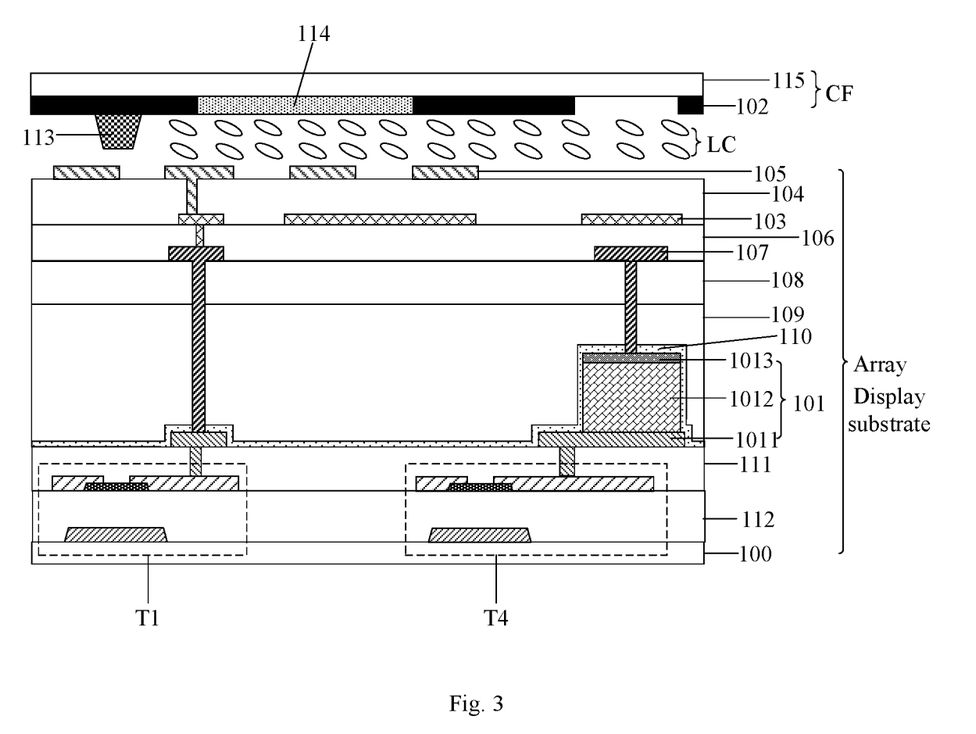
FIG. 3 is a schematic structural diagram of a section of a liquid crystal display panel provided by an embodiment of the present disclosure.

Aiming at the technical problems existing in the related art, embodiments of the present disclosure provide a display substrate Array, as shown in FIG. 2 and FIG. 3, including:
a first base substrate 100;
a plurality of sub-pixels (such as red sub-pixels R, green sub-pixels G and blue sub-pixels B), located on the first base substrate 100; wherein every two rows of sub-pixels constitute a pixel group;
a plurality of first gate lines Gate1, located in first row gaps between the pixel groups, and every first row gap is provided with two first gate lines Gate1; and
a plurality of photosensors 101, orthographic projections of every row of photosensors 101 on the first base substrate 100 completely cover second row gaps in the pixel groups and partially overlap with orthographic projections of the sub-pixels.

In the present disclosure, the first gate lines Gate1 of the adjacent sub-pixel rows are arranged at the first row gaps between the pixel groups, so that the first gate lines Gate1 do not need to be arranged at second row gaps in the pixel groups covered by the photosensors 101, and therefore a width of the second row gaps may be reduced to a certain degree. Further, in order to guarantee the same or similar brightness of adjacent rows, the first row gaps are adaptively reduced, so that the aperture opening ratio is increased.

For example, as shown in FIG. 3, the photosensor 101 may include a metal electrode 1011, a photoelectric conversion layer 1012 and a transparent electrode 1013 sequentially arranged in a stacked mode. The photoelectric conversion layer 1012 is of a PIN structure constituted by a P-type semiconductor layer, an intrinsic semiconductor layer and an N-type semiconductor layer in a stacked mode.

Optionally, in the display substrate provided by the embodiments of the present disclosure, a width of the first row gap and a width of the second row gap are equal or roughly equal, for example, within a +/−10% technology error range, so that the aperture opening ratios of all rows of sub-pixels are similar, and the uniformity of display is guaranteed.

Optionally, in the display substrate provided by the embodiments of the present disclosure, as shown in FIG. 2, overlapping areas of the orthographic projection of the photosensor 101 on the first base substrate 100 and the orthographic projection of the sub-pixels on one side of the second row gap are same as overlapping areas of the orthographic projection of the photosensor 101 on the first base substrate 100 and the orthographic projection of the sub-pixels on the other side of the second row gap, so that the shielding degrees of the photosensor 101 to the two adjacent rows of sub-pixels of the second row gap are the same, thereby guaranteeing the same aperture opening ratios of the aperture opening ratios of the two adjacent rows of sub-pixels of the second row gap.

Optionally, in the display substrate provided by the embodiments of the present disclosure, every n sub-pixels arrayed in a row direction constitute a pixel, wherein n is a positive integer.

A length of the photosensor 101 in the row direction is equal to a length of a plurality of pixels in the row direction.

For example, in FIG. 2, n is 3, and the length of the photosensor 101 in the row direction is equal to the length of two pixels in the row direction.

Optionally, in the display substrate provided by the embodiments of the present disclosure, as shown in FIG. 2 and FIG. 3, each sub-pixel includes: a first transistor T1 located between a layer where the plurality of photosensors 101 are located and the first base substrate 100.

In any first row gap, one row of first transistors T1 is electrically connected to one first gate line Gate1 at the first row gap, and the other row of first transistors T1 is electrically connected to the other first gate line Gate1 at the first row gap. That is, the first transistors T1 at the first row gap form a "back-to-back" type structure.

Optionally, in the display substrate provided by the embodiments of the present disclosure, as shown in FIG. 2 and FIG. 3, each sub-pixel further includes: a planar common electrode 103, a first insulating layer 104 and a slit pixel electrode 105 sequentially located on a side, facing away from the layer where the first transistors T1 are located, of the layer where the plurality of photosensors 101 are located. The slit pixel electrode 105 is electrically connected to the first transistor T1. Specifically, the slit pixel electrodes 105 realize electric connection through all conducting films between the slit pixel electrodes and the first transistors T1.

Figure 4:
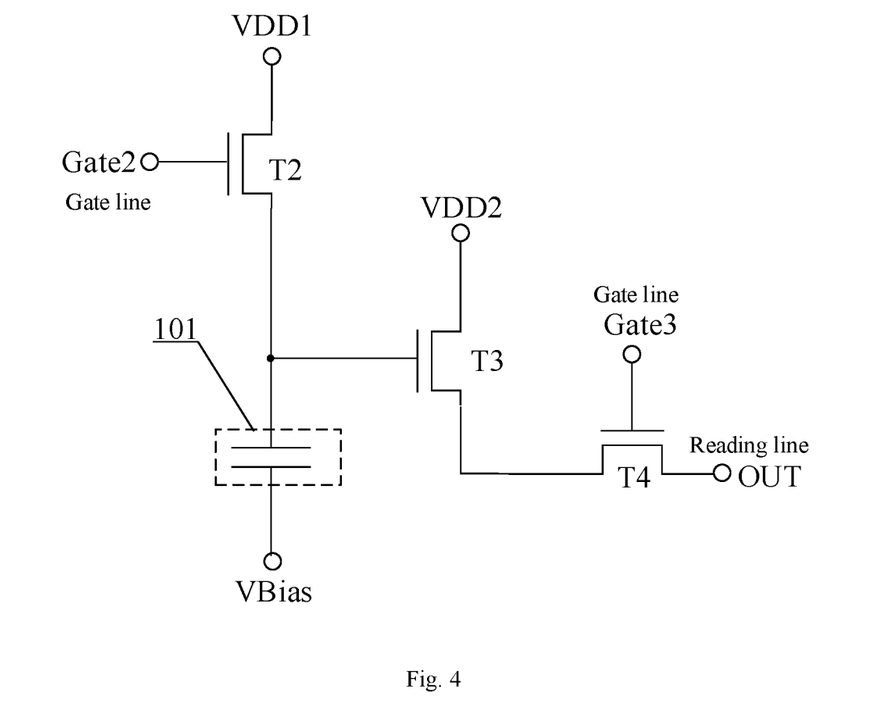
FIG. 4 is a schematic diagram of a photoelectric detection circuit provided by an embodiment of the present disclosure.

Optionally, the display substrate provided by the embodiments of the present disclosure, as shown in FIG. 2 and FIG. 4, further includes: drive circuits in one-to-one correspondence with the photosensors 101, and orthographic projections of the drive circuits on the first base substrate 100 are located in the second row gaps to avoid the aperture opening ratios.

Optionally, in the display substrate provided by the embodiments of the present disclosure, as shown in FIG. 4, the drive circuit(s) include: second transistor(s) T2, third transistor(s) T3 and fourth transistor(s) T4 arranged in the same layer as the first transistor(s) T1.

Gate electrodes of the second transistors T2 are electrically connected to the second gate lines Gate2, first electrodes of the second transistors T2 are electrically connected to a first power line VDD1, and second electrodes of the second transistors T2 are electrically connected to the photosensors 101.

Gate electrodes of the third transistors T3 are electrically connected to the photosensors 101, first electrodes of the third transistors T3 are electrically connected to a second power line VDD2, and second electrodes of the third transistors T3 are electrically connected to first electrodes of the fourth transistors T4.

Gate electrodes of the fourth transistors T4 are electrically connected to the third gate lines Gate3, and second electrodes of the fourth transistors T4 are electrically connected to a reading line OUT.

Figure 5:
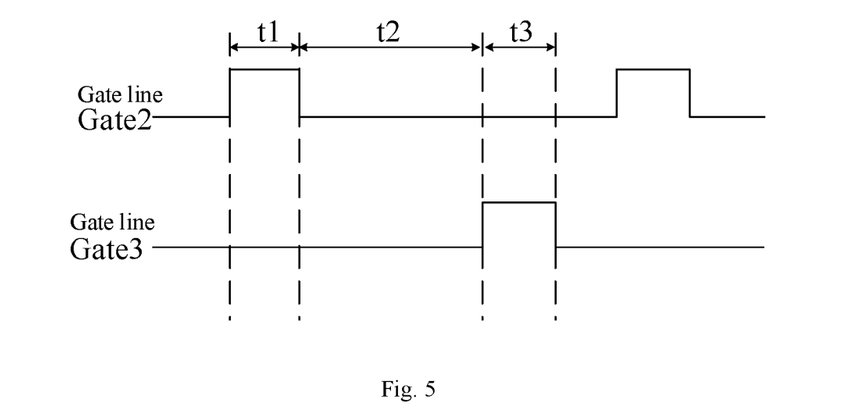
FIG. 5 is a working time sequence diagram of the photoelectric detection circuit as shown in FIG. 4.

For example, as shown in FIG. 5, in a reset stage t1, the second transistor T2 is conducted under control of the second gate line Gate2, so that the first power line VDD1 reset output ends of the photosensor 101 through the conducted second transistor T2. In an accumulating stage t2, all transistors are in a cut-off state, the photosensor 101 generates and store photocurrent signals in response to received visible light. In a reading stage t3, the third transistor T3 is conducted under control of the photocurrent signal stored in the photosensor 101, and the photocurrent signal is amplified and then written into the fourth transistor T4; and the fourth transistor T4 is conducted under control of the third gate line Gate3, and the amplified photocurrent signal is written into the reading line OUT.

Moreover, in order to save a mask process and realize thin design, the first gate lines Gate1, the second gate lines Gate2 and the third gate lines Gate3 may be arranged in the same layer, and the first power line VDD1, the second power line VDD2, the reading line OUT and the data line Data may be arranged in the same layer.

Optionally, in the display substrate provided by the embodiments of the present disclosure, the orthographic projections of the second gate lines Gate2 and the third gate lines Gate 3 on the first base substrate 100 are located in the second row gaps, so as to avoid influencing the aperture opening ratio.

Based on the same inventive concept, embodiments of the present disclosure provide a liquid crystal display panel, including the display substrate Array provided by the embodiments of the present disclosure. Since a principle for solving problems of the liquid crystal display panel is similar to a principle for solving problems of the display substrate, implementing of the liquid crystal display panel may refer to examples of the display substrate, and repetitions will not be repeated.

For example, the liquid crystal display panel provided by the embodiments of the present disclosure, as shown in FIG. 2 and FIG. 3, including the display substrate Array and a color film substrate CF oppositely arranged, and a liquid crystal layer LC between the display substrate Array and the color film substrate CF. The color film substrate CF includes: the black matrix 102.

The black matrix 102 includes: first parts 1021 covering the second row gaps. A first overlapping area of an orthographic projection of a first part 1021 on the first base substrate 100 and the orthographic projections of the sub-pixels on one side of the second row gap is same as a first overlapping area of the orthographic projection of the first part 1021 on the first base substrate 100 and the orthographic projections of the sub-pixels on the other side of the second row gap, so as to guarantee the same aperture opening ratios of the two rows of sub-pixels on two sides of the second row gap.

Optionally, in the liquid crystal display panel provided by the embodiments of the present disclosure, in order to enable light rays reflected through fingers to be irradiated to the photosensors, as shown in FIG. 2 and FIG. 3, the first parts 1021 have a plurality of openings, and the orthographic projections of the photosensors 101 on the first base substrate 100 are located in orthographic projections of the openings.

Optionally, in the liquid crystal display panel provided by the embodiments of the present disclosure, as shown in FIG. 2 and FIG. 3, the black matrix 102 may further include: second parts 1022 covering the first row gaps. A second overlapping area of an orthographic projection of the second part 1022 on the first base substrate 100 and the orthographic projections of the sub-pixels on one sides of the first row gap is same as a second overlapping area of the orthographic projection of the second part 1022 on the first base substrate 100 and the orthographic projections of the sub-pixels on the other side of the first row gap, so as to enable the aperture opening ratios of two rows of sub-pixels on the two sides of the first row gaps to be same.

Optionally, in the liquid crystal display panel provided by the embodiments of the present disclosure, the first overlapping area and the second overlapping area are the same, so as to enable the aperture opening ratios of each row of sub-pixels to be same.

Generally, in the liquid crystal display panel provided by the embodiments of the present disclosure, as shown in FIG. 3, the display substrate may further include: a second insulating layer 106, a bias voltage line 107, a third insulating layer 108, a first planarization layer 109, a side wall protection layer 110, a second planarization layer 111 and a gate insulating layer 112. The slit pixel electrode 105 is electrically connected to the first transistor T1 through corresponding wirings in the planar common electrode 103, the bias voltage line 107 and the metal electrode 1011. The color film substrate CF may further include: color resistance layers 114 (for example including a red light color resistance layer, a green light color resistance layer and a blue light color resistance layer), a spacer layer 113 and a second base substrate 115.

Based on the same inventive concept, embodiments of the present disclosure further provide a liquid crystal display device, including the liquid crystal display panel provided by the embodiments of the present disclosure, and a backlight module located on a light-in side of the liquid crystal display panel. For example, the backlight module may be a direct type backlight module, and may also be a side type backlight module. For example, the liquid crystal display device may be any products or elements with a display function, such as a mobile phone, a tablet computer, a television, a display, a notebook computer, a digital photo frame, a navigator, a smart watch, a fitness wrist strap and a personal digital assistant. Other necessary components of the liquid crystal display device should be understood by those ordinarily skilled in the art to be included, which is not repeated herein, and should not be limited to the present disclosure. In addition, since a principle for solving problems of the liquid crystal display device and the principle for solving problems of the liquid crystal display panel are similar, the implementation of the liquid crystal display device may refer to the examples of the liquid crystal display panel, and repetitions are not repeated.

According to the display substrate, the liquid crystal display panel and the liquid crystal display device provided by the embodiments of the present disclosure, the display substrate includes: the base substrate; the plurality of sub-pixels (such as red sub-pixels R, green sub-pixels G and blue sub-pixels B), located on the base substrate; every two rows of sub-pixels constituting one pixel group; the plurality of first gate lines, located in the first row gaps between the pixel groups, and two first gate lines being arranged at the first row gap between every two pixel groups; the plurality of photosensors, orthographic projections of each row of photosensors on the first base substrate completely covering the second row gaps in the pixel groups, and overlapping partially with the orthographic projections of the sub-pixels. In the present disclosure, the first gate lines of the adjacent sub-pixels are arranged in the first row gaps between the pixel groups, so that the first gate lines do not need to be arranged in the second row gaps in the pixel groups covered by the photosensors, and therefore the width of the second row gaps in the pixel groups may be reduced to a certain degree. Further, in order to guarantee the same or similar brightness of adjacent rows, the first row gaps between the pixel groups are adaptively reduced, so as to increase the aperture opening ratio.

Apparently, those skilled in the art may carry out various modifications and variations on the embodiment of the present disclosure without facing away from the spirit and scope of the embodiment of the present disclosure. Thus, if these modifications and variations of the embodiment of the present disclosure fall within the scope of the claims of the present disclosure and equivalent technologies thereof, the present disclosure also intends to include these modifications and variations.

What is claimed is:

1. A display substrate, comprising
   a base substrate;
   a plurality of sub-pixels on the base substrate, every two rows of sub-pixels constituting a pixel group;
   a plurality of first gate lines at first row gaps between adjacent pixel groups, two first gate lines being arranged at each first row gap; and
   a plurality of photosensors; wherein orthographic projections of each row of photosensors on the base substrate completely cover a second row gap in the pixel group, and partially overlap with orthographic projections of the sub-pixels;
   wherein each of the sub-pixels comprises:
      a first transistor between a layer where the plurality of photosensors are located and the base substrate; and
      a planar common electrode, an insulating layer and a slit pixel electrode sequentially located on a side, facing away from a layer where the first transistors are located, of the layer where the plurality of photosensors are located;
      wherein in one first row gap, one row of the first transistors is electrically connected to one first gate line at the first row gap, and another row of the first transistors is electrically connected to another first gate line at the first row gap; and
      the slit pixel electrodes are electrically connected to the first transistors.

2. The display substrate according to claim 1, wherein a width of the first row gap is equal to a width of the second row gap.

3. The display substrate according to the claim 1, wherein an overlapping area overlapped by the orthographic projections of the photosensors on the base substrate with orthographic projections of sub-pixels on one side of the second row gap is same as an overlapping area overlapped by the orthographic projections of the photosensors on the base substrate with orthographic projections of sub-pixels on another one side of the second row gap.

4. The display substrate according to claim 1, wherein every n sub-pixels arrayed in a row direction constitute one pixel, and n is a positive integer; and
   a length of the photosensor in the row direction is equal to a length of a plurality of pixels in the row direction.

5. The display substrate according to claim 1, further comprising:
   drive circuits in one-to-one correspondence with the photosensors;
   wherein orthographic projections of the drive circuits on the base substrate are in the second row gaps.

6. The display substrate according to claim 5, wherein the drive circuit comprises:
   a second transistor, a third transistor and a fourth transistor arranged on a layer same as a layer where the first transistor is located;
   wherein a gate electrode of the second transistor is electrically connected to a second gate line, a first electrode of the second transistor is electrically connected to a first power line, and a second electrode of the second transistor is electrically connected to the photosensor;

a gate electrode of the third transistor is electrically connected to the photosensor, a first electrode of the third transistor is electrically connected to a second power line, and a second electrode of the third transistor is electrically connected to a first electrode of the fourth transistor; and a gate electrode of the fourth transistor is electrically connected to a third gate line, and a second electrode of the fourth transistors is electrically connected to a reading line.

7. The display substrate according to claim 6, wherein orthographic projections of the second gate line and the third gate line on the base substrate are in the second row gap.

8. A liquid crystal display panel, comprising:
a display substrate and a color film substrate at opposite positions, and
a liquid crystal layer between the display substrate and the color film substrate;
wherein the display substrate is the display substrate according to claim 1.

9. The liquid crystal display panel according to claim 8, wherein the color film substrate comprises:
a black matrix;
wherein the black matrix comprises:
first parts covering the second row gaps;
wherein a first overlapping area overlapped by an orthographic projection of the first part on the base substrate with orthographic projections of sub-pixels on one side of the second row gap is same as a first overlapping area overlapped by the orthographic projection of the first part on a base substrate with orthographic projections of sub-pixels on another one side of the second row gap.

10. The liquid crystal display panel according to claim 9, wherein the first parts are provided with a plurality of openings, and orthographic projections of the photosensors on the base substrate are in orthographic projections of the openings.

11. The liquid crystal display panel according to claim 9, wherein the black matrix further comprises:
second parts covering the first row gaps;
wherein a second overlapping area overlapped by an orthographic projection of the second part on the base substrate with orthographic projections of sub-pixels on one side of the first row gap is same as a second overlapping area overlapped by the orthographic projection of the second part on the base substrate with orthographic projections of sub-pixels on another one side of the first row gap.

12. The liquid crystal display panel according to claim 11, wherein the first overlapping area is same as the second overlapping area.

13. A liquid crystal display device, comprising:
the liquid crystal display panel according to claim 8, and
a backlight module on a light-in side of the liquid crystal display panel.

* * * * *